United States Patent

Bouadma

(10) Patent No.: US 6,751,246 B2
(45) Date of Patent: Jun. 15, 2004

(54) BURIED RIBBON SEMICONDUCTOR LASER AND A METHOD OF FABRICATION

(75) Inventor: Noureddine Bouadma, Paris (FR)

(73) Assignee: Avanex Corporation, Fremont, CA (US)

( * ) Notice: Subject to any disclaimer, the term of this patent is extended or adjusted under 35 U.S.C. 154(b) by 0 days.

(21) Appl. No.: 10/066,641

(22) Filed: Feb. 6, 2002

(65) Prior Publication Data

US 2002/0110170 A1 Aug. 15, 2002

(30) Foreign Application Priority Data

Feb. 13, 2001 (FR) .............................. 01 01912

(51) Int. Cl.$^7$ .............................................. H01S 5/00
(52) U.S. Cl. ............................ 372/46; 372/43; 372/45
(58) Field of Search ........................... 372/43, 45, 46

(56) References Cited

U.S. PATENT DOCUMENTS

| | | | | |
|---|---|---|---|---|
| 4,347,611 A | * | 8/1982 | Scifres et al. .............. | 372/45 |
| 5,568,501 A | | 10/1996 | Otsuka et al. | |
| 5,661,741 A | * | 8/1997 | Kakimoto ................ | 372/46 |
| 5,796,768 A | * | 8/1998 | Mersali et al. ............ | 372/45 |
| 6,261,855 B1 | * | 7/2001 | Suzuki .................... | 438/23 |
| 6,351,479 B1 | * | 2/2002 | Mori et al. ............... | 372/45 |

FOREIGN PATENT DOCUMENTS

GB   2 292 011 A   2/1996

OTHER PUBLICATIONS

Narui H et al.: "Very Low Threshold 780 nm AlGaAs SDH Lasers On p–TYPE GaAs Substrate Fabricated Using Single–Step MOCVD", Electronics Letters, IEE Stevenage, GB, Jun. 18, 1992, pp. 1282–1283, vol. 28, No. 13.

* cited by examiner

*Primary Examiner*—Paul Ip
*Assistant Examiner*—Leith A Al-Nazer
(74) *Attorney, Agent, or Firm*—Moser, Patterson & Sheridan, L.L.P.

(57) ABSTRACT

To fabricate a buried ribbon laser, a thin n-doped layer is formed on a p-doped layer immediately adjacent an active layer. After etching the active layer to form the ribbon, the ribbon is buried in an n-doped layer so that the four lateral faces of the ribbon are all in contact with an n-doped layer. One face is in contact with the thin layer and the other three faces are in contact with the burying layer. This improves the electrical confinement of the ribbon.

11 Claims, 4 Drawing Sheets

BURIED RIBBON SEMICONDUCTOR LASER AND A METHOD OF FABRICATION

CROSS-REFERENCE TO RELATED APPLICATIONS

This application is based on French Patent Application No. 01 01 912 filed Feb. 13, 2001, the disclosure of which is hereby incorporated by reference thereto in its entirety, and the priority of which is hereby claimed under 35 U.S.C. §119.

BACKGROUND OF THE INVENTION

Field of the Invention

The invention relates to buried ribbon semiconductor lasers, especially those used in optical telecommunications.

Prior art buried ribbon laser structures are described on page 60 of the paper by J. C. BOULEY entitled "Evolution et perspectives des structures laser pour télécommunications" [Evolution and perspectives for telecommunication laser structures] published in the review "'l'Echo des recherches" No. 130, 4th trimester 1987. As described in the upper part of page 60 of the paper, the active portion of a ribbon laser is formed of a rectangular cross section ribbon having a GaInAsP composition, for example, the proportions of the constituents of which depend on the required emission wavelength of the laser. The ribbon is buried in, i.e. entirely surrounded by, a medium of lower refractive index, for example InP. One face of the ribbon, for example the bottom face, is in contact with an n-doped InP layer and the other three lateral faces are in contact with a p-doped InP layer. Burying the active ribbon in the InP medium that completely surrounds it has two purposes. Firstly, it confines the carriers injected into the ribbon, due to the presence of the p-n junction, because of the difference in forbidden band gap $E_g$ between InP and GaInAsP, for example $E_g=0.35$ eV for an active band at 1.3 μm. It also achieves bidirectional guiding of light because of the large difference in the refractive index n between InP and GaInAsP. Because of the small dimensions of its section (width approximately 1.5 μm, thickness 0.15 μm), the waveguide formed by the active layer accepts only one mode of propagation, namely the fundamental mode, whose size is substantially equivalent to the dimensions of the guide. The known benefit of this geometrical configuration is that it produces lasers with a very low threshold current, because the overlapping and therefore interaction of the fundamental mode and the volume of material excited by injecting carriers becomes the optimum. Laser oscillation is then obtained by forming a Fabry-Pérot cavity by cleaving transverse faces of the ribbon.

The various buried ribbon laser structures differ from each other in the methods used to inject electrons into the buried ribbon and confine them there and in the technologies employed.

The theory and fabrication of one buried ribbon structure laser are described hereinafter with reference to FIGS. 1 and 2 of the accompanying drawings. The structure includes, in the direction of the arrow 1 in FIG. 1:

an electrical contact layer 2, for example a layer of TiAu or any other metal alloy, an n-doped InP layer 3, deposited on the latter layer, the active laser material, for example GaInAsP, ribbon 4, whose composition determines the wavelength obtained; the ribbon has six faces, one face 41, shown at the bottom in FIG. 1, which is in contact with the layer 3, a top face 42 parallel to the face 41 and two faces 43, 44 parallel to each other and perpendicular to the faces 41, 42, and finally transverse cleaved faces 45, 46, a p-doped InP layer 5; the layer 5 is in contact with the ribbon 4 on three faces 42–44 of the ribbon, the bottom face 41 being in contact with the n-doped InP layer 3, and finally, a contact layer 6, for example a layer of AuPt.

One embodiment of buried structures of this kind is described hereinafter with reference to FIG. 2, with additional information thereon.

FIG. 2 has portions A, B, C each representing a cross section of the product obtained in various fabrication steps.

An n-doped InP buffer layer 3-2 with an appropriate dopant concentration is grown epitaxially on an InP substrate 3-1 which is strongly n-doped, for example doped to a dopant concentration of $5\times10^{18}$. Because of the manner in which it is grown, this layer has better controlled crystal properties than the layer 3-1.

The InGaAsP active layer 4 is then grown epitaxially, followed by an InP layer 35 to protect the active layer 4. A dielectric mask layer 9 is then deposited to protect the active layer 4 during subsequent fabrication steps, for example a layer of $SiO_2$.

The product obtained at the end of this first step is shown in portion A of FIG. 2.

This is followed by deep etching to form a mesa 11 which emerges above a surviving portion of the layer 3-2. The width of the mesa 11 is the width of the ribbon 4. The mesa 11 includes from its top portion to its bottom portion what remains of the layers 9, 35, 4 after etching and a portion of the thickness of the layer 3-2 on either side of the mesa 11.

The product obtained after deep etching is shown in portion B of FIG. 2. In portions B and C of FIG. 2 the faces 43, 44 are shown perpendicular to the planes of the layers, for example the layers 3 and 4. It must nevertheless be understood that because of the etching method used these faces are not plane. As a result the angles between planes tangential to the faces 43, 44 and a plane parallel to the layers can differ from one layer to another.

After removing the mask 9, the p-doped InP layer 5 is grown epitaxially all around the exposed portion of the ribbon 4. The ribbon 4 therefore has its lateral faces 42, 43 and 44 directly adjacent a p-doped InP material, thereby achieving the optical confinement effect, due to the difference in optical index between the material of the layer 4 and the material of the adjacent layers, and the electrical confinement of the ribbon 4, due to the n-p junction between the layers 3 and 5. The layer 5 is formed of two superposed portions 5-1 and 5-2. The layer 5-1 is immediately on top of the layers 3-2 and 9, so that the ribbon is buried in the layer 5-1. The layer 5-2 situated immediately on top of the layer 5-1 is more strongly p-doped than the layer 5-1 to improve the contact with the metal contact layer 6 deposited afterwards, for example a layer of AuPt.

The electrical confinement effect can be increased by ion bombardment using H+ protons of portions of the layer 5 on either side of the mesa of the ribbon 4 and not adjacent the mesa. The bombarded portions 5-3 in portion C of FIG. 2 are therefore rendered non-conductive. This limits current leaks.

SUMMARY OF THE INVENTION

The buried ribbon BRS laser is considered to be one of the simplest buried ribbon heterostructure lasers. However, as the current confinement of BRS lasers is obtained by a forward-biased p-n junction, the current leaks depend greatly on the p-doping level and on the current injected, as shown in FIG. 3. FIG. 3 shows curves indicating the percentage of leakage current plotted on the vertical axis relative to the bias current plotted on the horizontal axis for different levels of p-doping of the p-doped InP layer 5 in which the ribbon 4 is buried. The p-doping values are indicated on each curve. The level of n-doping of the ribbon 4 is usually from $10^{18}$ to $2 \times 10^{18}/cm^3$. The curves, especially that whose p-doping is $5 \times 10^{18}$, suggest that a high level of p-doping reduces the leakage current, in particular if the bias current is high.

Moreover, it is known in the art that incorporating a high level of p impurities, for example Zn, in the InP layer 5 during the second stage of epitaxial growth leads to diffusion of the impurities, in particular into the adjacent layer forming the laser active layer 4 of the device. The impurities in the active layer 4 introduced in this way form non-radiating recombination sites and this degrades the performance of the laser.

Also, the concentrations of the impurities, for example Zn, during their incorporation into the InP layer vary as a function of the orientation of the walls of the substrate. Thus, for the same growth conditions, the concentration of Zn in InP in the <111> orientation can vary from being 7 times greater to 10 times lower than that for the <100> orientation. It is also known in the art, as indicated above, that the walls 43, 44 of the ribbon of a BRS are obtained by etching and are not plane. The walls can be considered to consist of a set of adjacent facets with different orientations. As a result of this, it can be expected that the Zn concentration will vary greatly along the walls during epitaxial growth on top of the walls 43, 44. It follows from the foregoing explanations that, even if relatively low Zn concentrations are being considered, the concentrations could be locally very high along the walls 43, 44, therefore leading to diffusion of Zn into the active layer 4. The characteristics of the laser, including in particular its gain, optical losses, leakage current, characteristic device temperature and dynamic performance, are strongly degraded by this, especially as the ribbon is narrow.

The inventor has noticed that, during growth of an InP layer adjacent the active layer, diffusion of n-type impurities such as Si present in an n-doped InP layer toward the active layer is less serious than the diffusion of p-type impurities such as Zn present in a p-doped InP layer.

To reduce the diffusion of Zn into the active layer, in a first embodiment of the invention a thin layer of a material such as n-doped InGaAsP or InP, for example, is introduced between the active layer 4 and a p-doped layer. In this way the bottom and top lateral faces of the ribbon 4 are in contact with an n layer, this n layer preventing p-type impurities from diffusing into the layer 4 through the top and bottom faces of the layer 4. Wide contact lasers fabricated in this way have shown improved characteristics, for example the quantum yield, especially at the lowest level of threshold current, with good reproducibility. Thus in laser devices with wide contacts the addition of a thin n-doped layer to the basic structure to reduce the diffusion of Zn into the active layer through the <100> orientation has proved effective and is usually reproducible. However, BRS ribbon lasers with current confinement achieved by a forward biased junction continue to show mediocre performance and poor reproducibility, despite the presence of this thin separation layer.

Because of the method of fabricating BRS structures, less improvement is obtained using this technique. As mentioned above, the method includes delimiting and etching a narrow mesa 11 followed by growing a current confinement InP-p layer that also provides optical confinement. As a result the lateral walls 43, 44 of the mesa 11 are not covered with an n-doped layer. The inventor had assumed that, in the case of the BRS structure, the relative ineffectiveness of the thin layer of n-doped material between the active layer and the p layer burying the ribbon was explained by the fact that Zn continued to diffuse through the unprotected walls 43, 44, giving rise to the problems reported above. This is why, in a second embodiment, the invention is aimed at a BRS laser and a method of fabricating a BRS laser in which the active laser is further protected from diffusion of p-type impurities coming from all the layers adjacent any wall of the ribbon, i.e. not only the top and bottom walls of the ribbon, but also the lateral walls connected to the top and bottom walls. This produces an improved BRS laser having all the qualities usually found in the BRS laser, but additionally capable of emitting more powerful laser radiation thanks to a high bias current, with no excessive leakage current to cause the problems reported above.

Consequently, in this embodiment of the invention, growth starts with a confinement layer, rather than by growing an InP n confinement layer, as in the prior art. A thin n-doped InP layer is grown immediately before growing the active layer so that the bottom face of the active layer is adjacent the thin n-doped layer. By "thin" is meant less than approximately 1 $\mu$m thick and preferably of the order of 50 nanometers thick.

The active layer is then grown. Thus the active layer is sandwiched between two n-doped layers and has not at any time been in contact with a p-doped layer. Then, after etching to delimit the mesa incorporating the ribbon, an InP-n confinement layer is grown. In this way the lateral walls 43, 44 are surrounded by n-doped materials instead of being surrounded by p-doped materials, for example materials doped with Zn. This prevents diffusion of Zn into the active layer through all the walls of the ribbon.

Accordingly, the invention relates to a method of fabricating a set of buried ribbon semiconductor laser chips. The method includes the following steps:

forming a p-doped confinement layer, forming a thin n-doped layer, forming the laser active layer, locally etching said active layer to form it into a ribbon, and burying said ribbon in an n-doped layer so that the lateral faces of the ribbon are all adjacent an n-doped layer.

This eliminates the diffusion of p dopant into the active layer since at no time during the fabrication process is the active layer in contact with a p-doped layer.

The method according to the invention has two variants. In a first variant, produced on a substrate wafer with at least a top layer made from a p-doped material, after the step of burying the mesa in the n-doped confinement layer, a metallization layer is deposited on top of the n-doped burying layer.

The original wafer is then overturned onto a second wafer so that the metallization layer deposited is in contact with the second wafer.

The substrate forming the initial wafer is removed down to the p-doped material layer on which the n-doped confinement layer burying the mesa was grown.

A metallization layer is then deposited on said p-doped material layer, which is now the top layer because of overturning the wafer and removing the substrate. Before depositing the metallization layer, a very strongly p-doped intermediate contact layer is preferably deposited to provide an improved ohmic contact.

In a second variant, after the step of burying the mesa in the n-doped confinement layer the width of the burying layer is reduced by etching on either side of the mesa and after masking the remaining top surface of the burying layer an insulative layer is selectively deposited laterally on either side of the mesa.

The top layer of metallization is then deposited after removing the mask.

The buried ribbon laser in accordance with the invention is characterized in that two of its lateral faces, i.e. its bottom and top surfaces, are adjacent n-doped layers. Obviously, as explained above, it is very preferable for the four lateral faces of the ribbon, i.e. not only the top and bottom faces but also the two faces connected to the top and bottom faces, to be adjacent an n-doped layer.

BRIEF DESCRIPTION OF THE DRAWINGS

Embodiments of the invention will now be described with reference to the accompanying drawings, in which.

DETAILED DESCRIPTION OF THE PREFERRED EMBODIMENTS

Figure 1:
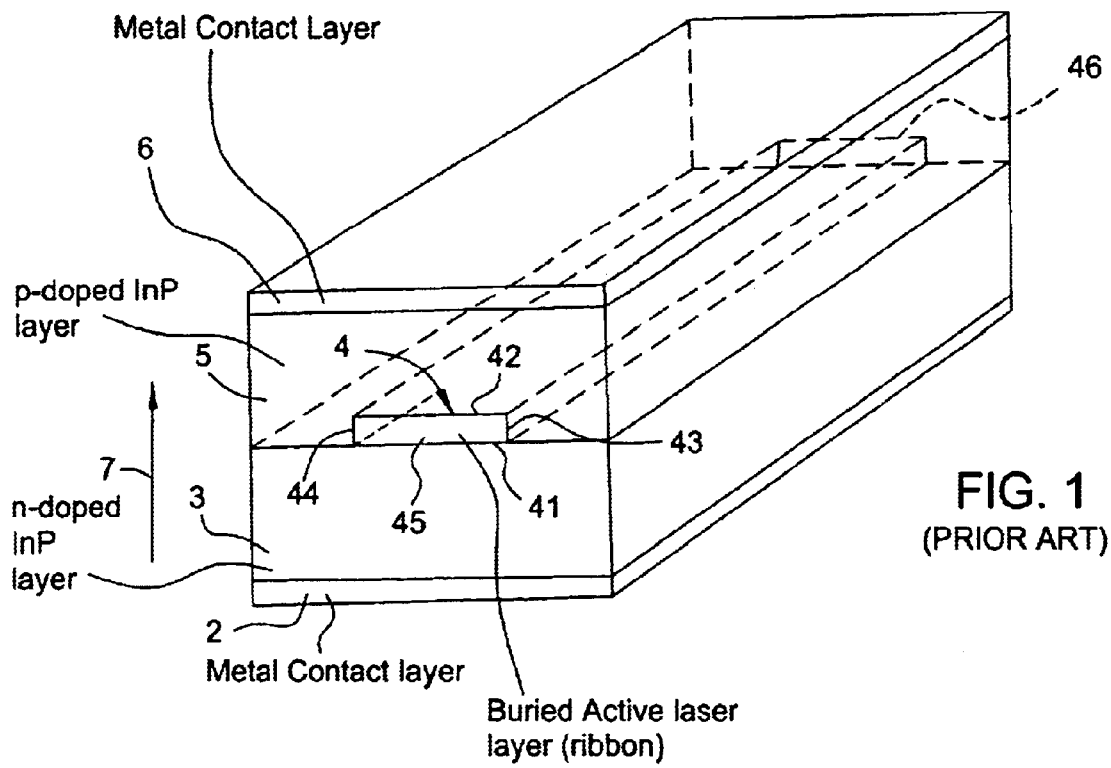
FIG. 1, already described, is a theoretical diagram of a buried ribbon laser showing the various layers and the ribbon.
Figure 3:
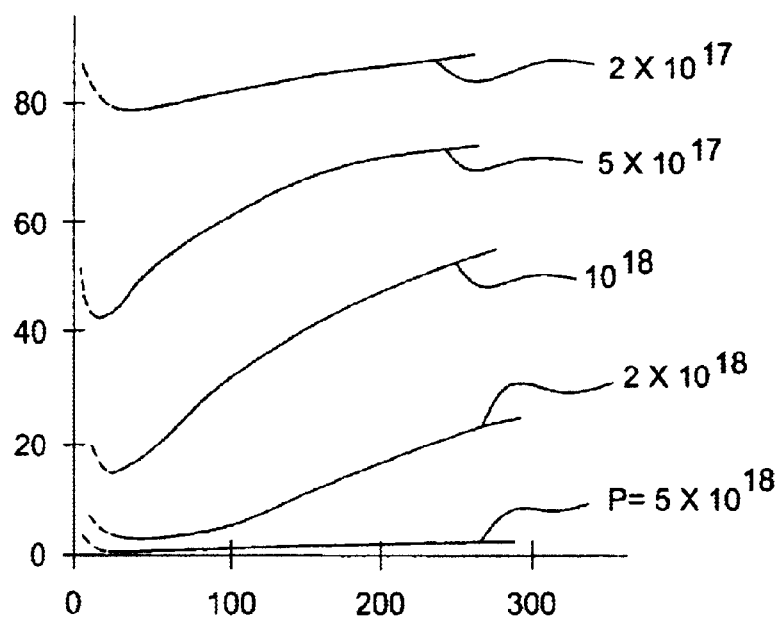
FIG. 3, already described, shows a set of curves representing the percentage leakage current as a function of the bias current for different p-doping concentrations.
Figure 2:
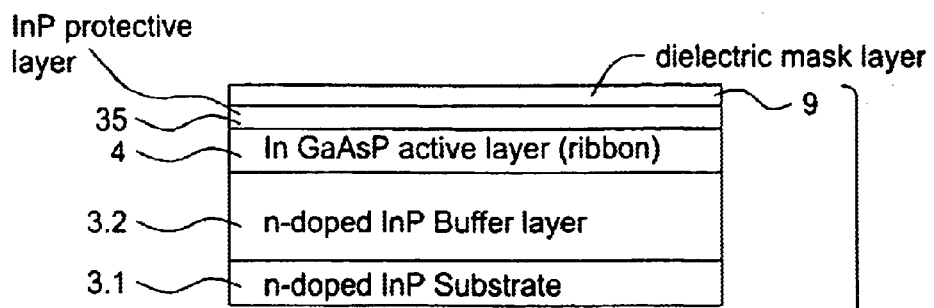
FIG. 2, already described, shows in cross section the progress of the fabrication of a buried ribbon layer, and has three portions A, B and C.
Figure 2:
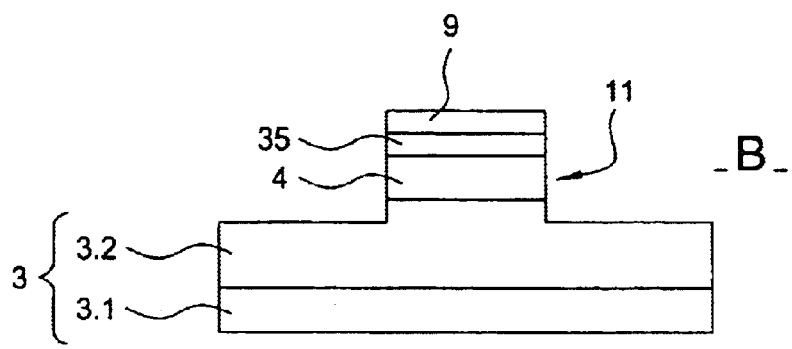
Figure 2:
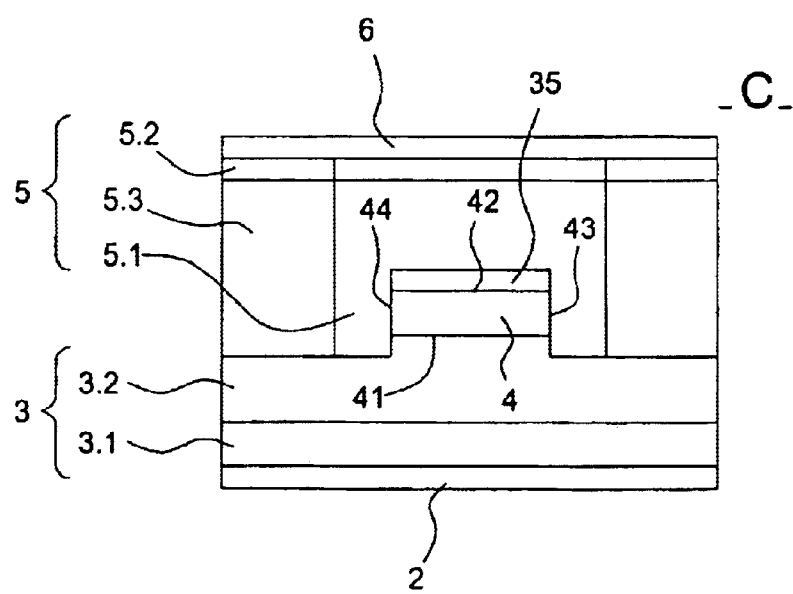

As is known in the art, fabrication begins with an n-doped or p-doped III-V material, for example InP, substrate wafer, on which successive layers are deposited. A large number of chips are produced on the wafer, which must subsequently be separated. The description that follows with reference to FIG. 4 concerns only one chip. The fabrication process on an InP III-V substrate 3-1 is as follows:

a) A non-doped InP buffer layer 3-2 approximately 0.5 μm thick is formed by a first stage of epitaxial growth. A p+ InGaAs contact layer 15 approximately 0.3 μm thick is then grown epitaxially. As explained below, this layer is intended to receive a metal layer, for example a layer of AuPt, for a p contact on its face which at this stage of fabrication is adjacent the layer 3-2.

b) A p InP confinement layer 16 approximately 3 μm thick and with a dopant concentration of 1.5 to $2\times10^{18}/cm^3$ is then grown epitaxially.

c) This is followed by a thin n-doped layer 17 of InGaAsP approximately 50 nm thick, for example doped with Si.

d) The active layer 4 is then grown.

e) Finally, a thin layer 18 of non-doped InP approximately 0.1 μm thick is formed to protect the active layer 4 during the fabrication process.

Figure 4:
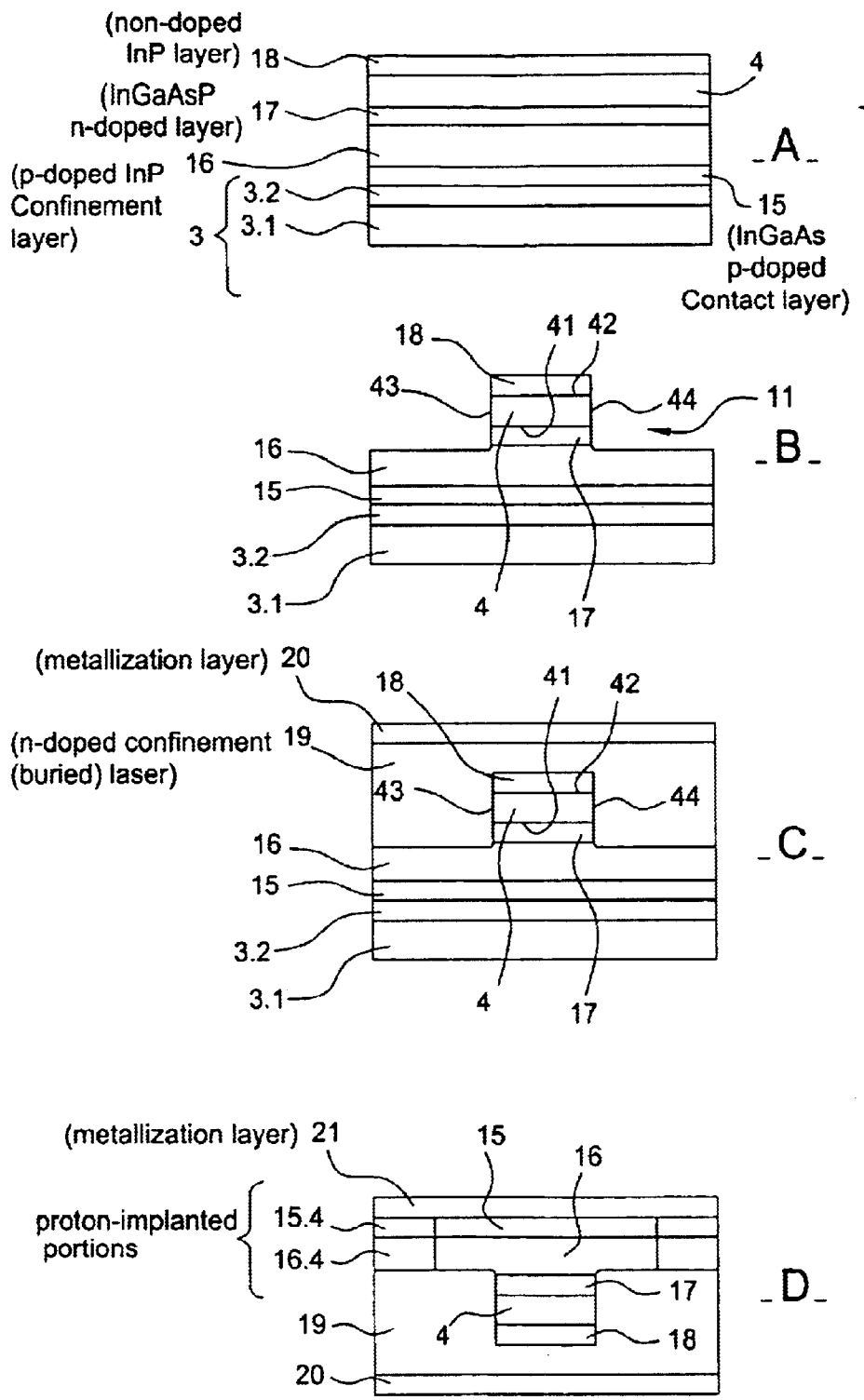
FIG. 4 shows various stages in the fabrication of a ribbon laser by a first embodiment of a method according to the invention, and has four portions A, B, C and D.

After the above operations, the device takes the form shown in portion A of FIG. 4.

Fabrication then continues as follows:

f) Etching, for example dry etching, to delimit the mesa 11 carrying the ribbon 4 continues down to the p InP layer 16. At the end of the etching step the device takes the form shown in portion B of FIG. 4. The bottom layers 3-1, 3-2 and 15 are not modified. A portion of the layer 16 emerges above the remainder of the layer 16. This emergent portion of the layer 16 supports the remainder of the layer 17, the remainder of the layer 4 forming the ribbon 4 and the remainder of the layer 18. The emerging portion of the layer 16 and the remainders of the layers 17, 4, 18 together form the mesa 11.

g) An n-doped InP confinement layer 19 3 μm thick and with a dopant concentration of $2\times10^{18}/cm^3$, for example, is then grown by a second stage of epitaxial growth.

h) An n metallization layer 20, for example a layer of TiAu, is then deposited. At the end of this phase of the fabrication process the device takes the form shown in the portion C of FIG. 4.

i) V-shaped grooves are then formed on the wafer to prepare the lines for separating the chips.

j) After thinning the substrate 3 to a thickness of approximately 120 μm by mechanical or chemical polishing, the original wafer formed in this way is overturned onto a second wafer, for example an Si wafer, on which metallization lands have already been traced.

k) The remaining thickness of the InP substrate 3, which because the wafer has been overturned is now on the top, is then removed, initially by fast etching and then by slower etching to remove the last traces. The contact layer 15 also serves as a stop layer for this etching.

l) A standard p metallization layer 21, for example a layer of AuPt, is deposited. The layer 3 formed of the layers 3-1 and 3-2 having been uncovered, the metallization layer 21 is deposited on top of the contact layer 15.

Protons can then be implanted in the outside lateral portions 15-4 and 16-4 of the p-doped layers 15 and 16, respectively, to limit the leakage currents.

The final product takes the form shown in portion D of FIG. 4. The ribbon 4 is buried in an n-doped layer confinement or burying 19. It is separated from the p-doped layer 16 by a thin n-doped layer 17 so at no time has there been any migration of p dopant, for example Zn, toward the layer 4 forming the ribbon.

Figure 5:
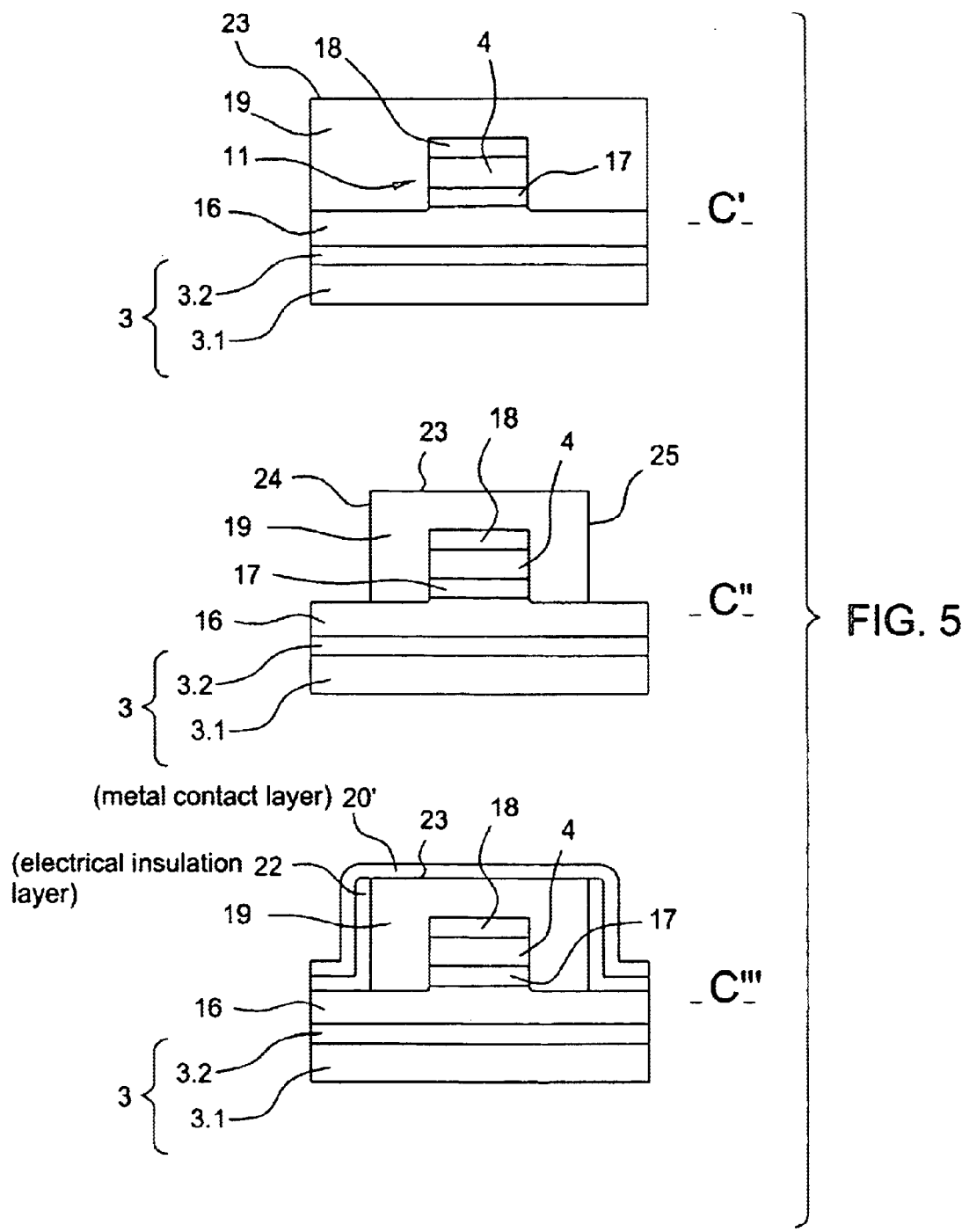
FIG. 5 shows various stages in the fabrication of a ribbon laser by a second embodiment of a method according to the invention, and has three portions C', C", C'''.

In a different embodiment in which the ribbon 4 is electrically insulated from the remainder of the structure in a different way, dielectric material layers 22 are interposed under conditions described next with reference to FIG. 5. FIG. 5 has portions C', C" and C'''.

For this embodiment steps b) through g) described above remain the same. The variation compared to the first embodiment begins in the state of fabrication of the buried ribbon laser shown in portion C of FIG. 4, with the following two differences. The p-doped contact layer 15 is not present and the metallization layer 20 has not been deposited. The situation is therefore that shown in portion C' of FIG. 5.

The device includes at this stage, as represented in the portion C' of the figure, from the bottom toward the top, a p-doped substrate 3 divided into two thicknesses 3-1 and 3-2, the p InP confinement layer 16, the thin layer 17 of n-doped material, the ribbon 4, and finally the protection layer 18. The ribbon 4 is in a mesa 11 formed by a portion of the layer 16 remaining after the etching to delimit the mesa and what remains of the layers 17, 4 and 18 after the etching to delimit the mesa 11. The mesa 11 is surrounded on three of its lateral faces 42–44 by the n-doped InP material layer 19 and on its fourth lateral face 41 by the thin n-doped material layer 17. The situation shown in portion C' is identical to the situation shown in portion C of FIG. 4, except that the metallization layer is not present and the p+ doped InGaAsP layer 15 is no longer needed. Also, this embodiment starts from a p-doped substrate.

From the above situation:

g1) Lateral etching of the n-doped confinement or burying layer 19, preferably symmetrically relative to the mesa 11, removes the portions on either side of the mesa 11 but not adjacent the mesa 11. After this etching of the layer 19 burying the mesa 11, the mesa 11 is still surrounded by its burying (confinement) layer 19, but the width of that layer has been reduced, for example to approximately four times the width of the ribbon 4. To fix an order of magnitude, if the ribbon 4 has a width of approximately 1.5 $\mu$m, the remainder of the layer 19 can have a width of approximately 6 $\mu$m.

After etching the burying layer 19, the device takes the form shown in portion C" of FIG. 5. The layer 19 has a top surface 23 and two surfaces 24, 25 substantially perpendicular to the planes of the layers.

g2) The next step is selective lateral deposition of a dielectric material layer 22, for example a layer of $Si_3N_4$ or $SiO_2$, masking the top surface 23 of the etched burying layer 19. The layer 22 is deposited in a single operation. Because it lies on either side of the mesa 11, it consists of two portions separated from each other by the width of the etched burying layer 19. Each portion of the layer 22 therefore covers the surface 24, 25 of the layer 19. The layers 22 are therefore substantially perpendicular to the plane of the top or bottom faces of the ribbon 4 and separated from each other by the width of the etched layer 19, i.e. approximately four times the width of the ribbon 4, as explained above. The portions of the layer 22 preferably also extend continuously with the layer 16 that they cover on either side of the mesa 11.

g3) The top surface 23 of the layer 19 is unmasked.

h') The n metal contact layer 20', for example a layer of TiAu, is then formed so that it covers at least the top portion 23 of the layer 19, but preferably so that it covers the top portion 23 and the electrical insulation layer 22. The state of the device produced by this preferred mode of depositing the contact layer 20', immediately after depositing that layer 20', is shown in portion C''' of FIG. 5.

The fabrication process then continues as in the previously described embodiment of the method according to the invention except for steps j) to k).

Step j is replaced by a step j' in which the substrate 3 is thinned to a thickness of approximately 120 $\mu$m by mechanical or chemical polishing. A metal, for example PtTiAu, is then deposited before separating the chips by cleaving them.

In this embodiment it is not possible to perform proton implantation in the n-doped InP material. Electrical confinement is then improved by the insulating layer 22.

What is claimed is:

1. A method of fabricating a semiconductor laser structure, said method comprising:

(a) providing a group III-V material (3-1);
   (b) forming a p-doped confinement layer (16) overlaying the group III-V material substrate;
   (c) forming a thin n-doped-layer (17) overlaying said p-doped confinement layer;
   (d) growing an active layer (4) overlaying said p-doped confinement layer;
   (e) forming a thin n-doped layer overlaying the active layer;
   (f) locally etching said active layer, said thin n-doped layer and said p-doped confinement layer to form a rectangular-shaped mesa (11), the rectangular-shaped mesa having a ribbon, the ribbon referring to the active layer after etching; and
   (g) burying said rectangular-shaped mesa in an n-doped burying layer (19), the rectangular-shaped mesa having a first lateral (top) surface, a second lateral (a first side) surface, a third lateral (a second side) surface, and a fourth lateral (bottom) surface;

wherein the first, second and third lateral surfaces (42, 43, 44) of the rectangular-shaped mesa are surrounded by the n-doped burying layer (19), and the fourth lateral surface (41) by the thin n-doped layer (17);

wherein the thin n-doped layer (17) separates the p-doped confinement layer (16) and the ribbon (4) so that there is no migration of p dopant toward the active layer.

2. The method claimed of claim 1, wherein the burying step (g) comprises:

(g1) etching to reduce the width of said layer, to remove portions on either side of said mesa but not adjacent said mesa so that after such etching said ribbon is still buried in said burying layer, the etched layer having a reduced width, a top surface and surfaces substantially perpendicular to the plane of the top or bottom faces of said ribbon; and
   (g2) masking said top surface of said burying layer of reduced width and depositing a dielectric material insulative layer so that said insulative layer covers lateral surfaces of said burying layer and portions of said p-doped confinement layer on either side of said mesa.

3. The method of claim 2, after the masking step (g2) of depositing a dielectric material insulating layer, further comprising:

(h') depositing a metallization layer on top of said etched burying layer.

4. The method claimed of claim 1, after the burying step g), further comprising:

(h) depositing a metallization layer on top of said burying layer.

5. The method of claim 4, after the providing step (a), further comprising:

(a) epitaxially growing a p-doped contact layer on said group III-V material substrate, implanting protons in portions of the p-doped layers.

6. The method of claim 4, after depositing of metallization layer (h), further comprising:

(k) overturning said wafer onto a second wafer and eliminating said substrate; and
   (l) depositing a metallization layer on top of said contact layer.

7. The method claimed in claim 1, wherein said thin layer is less than 1 $\mu$m thick.

8. A semiconductor laser structure, comprising:

a group III-V substrate (3-1);
   a non-doped buffer layer overlaying the group III-V substrate (3-2);
   a p-doped contact layer (15) overlaying the non-doped buffer layer;

a p-doped confinement layer (16) overlaying the p-doped contact layer;

a thin n-doped layer (17) overlaying the p-doped confinement layer;

an active layer (4) overlaying the thin n-doped layer;

a thin layer of non-doped layer (18) overlaying the active layer; wherein a rectangular-shaped mesa is formed by etching the thin n-doped layer, the active layer, and the thin layer of non-doped layer, the rectangular-shaped mesa having a first lateral (top) surface, a second lateral (a first side) surface, a third lateral (a second side) surface, and a fourth lateral (bottom) surface, the thin n-doped layer separating the p-doped confinement layer and the active layer so that there is no migration of p dopant toward the active layer, the etched portion of the active layer being referred as a ribbon; and an n-doped burying layer surrounding the first, second and third lateral surfaces (42, 43, 44) and the fourth lateral surface (41) by the thin n-doped layer (17).

9. The buried ribbon laser claimed in claim 8 wherein an n-doped layer less than 1 m thick separates said ribbon from a p-doped layer.

10. The buried ribbon laser claimed in claim 8, including portions perpendicular to the planes of said top and bottom faces of said ribbon of a dielectric material layer on either side of said mesa incorporating said ribbon.

11. The buried ribbon laser claimed in claim 10 wherein the dielectric material layer portions on either side of said mesa incorporating said ribbon are separated from each other by a distance substantially equal to four times the width of said ribbon.

* * * * *